United States Patent [19]

Stoldt

[11] 4,220,303

[45] Sep. 2, 1980

[54] EDGE MOUNTING DEVICE

[75] Inventor: Clayton L. Stoldt, North Warren, Pa.

[73] Assignee: GTE Products Corporation, Stamford, Conn.

[21] Appl. No.: 950,187

[22] Filed: Oct. 10, 1978

[51] Int. Cl.$^2$ .......... H05K 1/04; H05K 7/12

[52] U.S. Cl. .......... 248/205 R; 339/125 R; 361/400

[58] Field of Search .......... 248/205 R; 361/400, 361/403; 339/130 R, 17 C, 17 L, 125 R; 85/1 H; 151/41.76; 52/586, 585

[56] References Cited

U.S. PATENT DOCUMENTS

| | | | |
|---|---|---|---|
| 1,409,524 | 3/1922 | Chase | 85/1 H |
| 3,335,386 | 8/1967 | Upton | 339/17 L |
| 3,491,328 | 1/1970 | Geis | 361/400 X |
| 3,803,533 | 4/1974 | Taplin | 339/125 R X |
| 3,993,390 | 11/1976 | Eigenbrode | 339/17 L X |
| 4,030,000 | 6/1977 | Stewart | 361/400 |
| 4,063,683 | 12/1977 | Jones | 339/125 R X |
| 4,080,028 | 3/1978 | Gilbert | 339/17 L |

FOREIGN PATENT DOCUMENTS

| | | | |
|---|---|---|---|
| 216293 | 7/1961 | Austria | 151/41.76 |
| 2348671 | 9/1973 | Fed. Rep. of Germany | 339/17 C |
| 1277406 | 10/1961 | France | 52/586 |
| 1442440 | 5/1966 | France | 339/125 R |
| 6409207 | 2/1966 | Netherlands | 339/17 C |

*Primary Examiner*—J. Franklin Foss
*Attorney, Agent, or Firm*—Robert E. Walter

[57] ABSTRACT

An apparatus for mounting a device on an exterior edge of a thin substrate includes a demountable member adapted to be positioned within an opening in the substrate in proximity to the edge. The demountable member includes means for engaging an interior edge of the opening for restraining outward and lateral movement of the demountable member. A fastener which engages the device is adjustably secured to the demountable member for urging the device toward the edge of the board.

2 Claims, 4 Drawing Figures

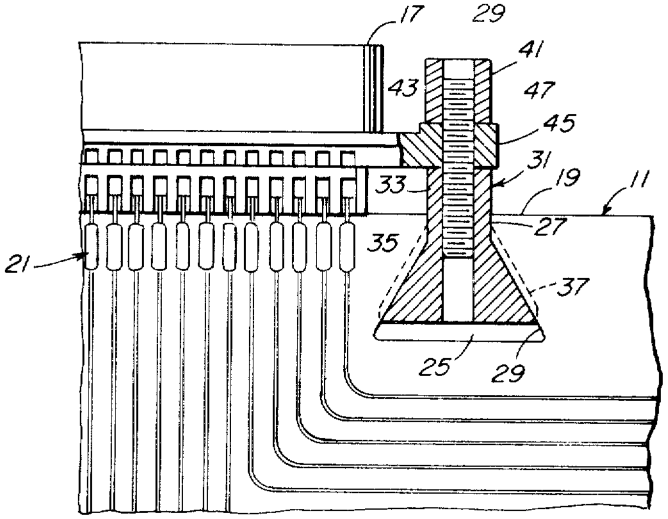
FIG. 1
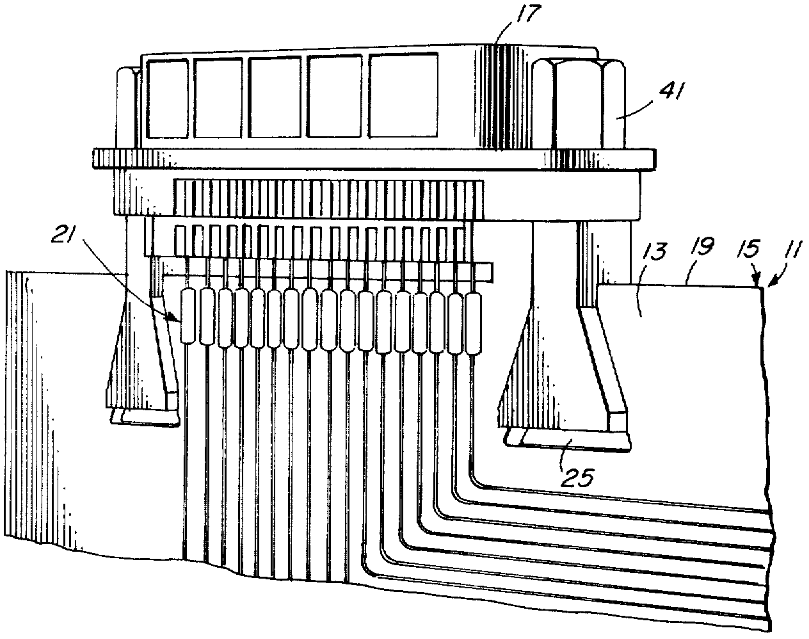
FIG. 2
FIG. 3
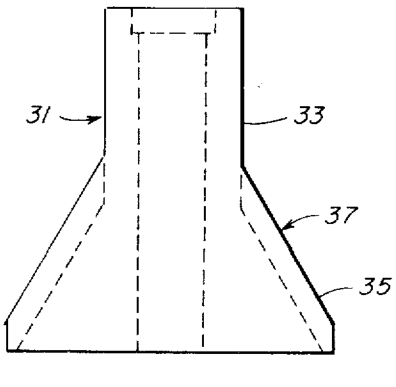
FIG. 4
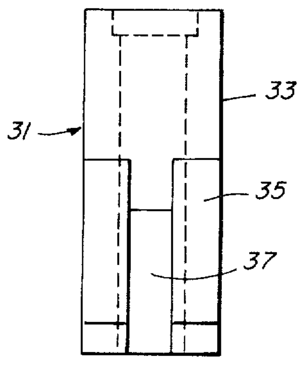

EDGE MOUNTING DEVICE

BACKGROUND OF THE INVENTION

The present invention relates to mounting a device on a narrow edge of a rigid planar substrate. It is particularly directed to mounting an electrical component on the edge of a printed wiring board.

Conventional mounting methods and fasteners are generally not effective when trying to attach a relatively large device to the narrow edge of a planar substrate. Due to the narrowness of the edge, screws or other fasteners often can not be employed.

A flange may be bolted or otherwise secured to a planar surface so as to form a shelf projecting outwardly therefrom and even with the edge. The device can thus be connected to the flange to provide a firm mounting. Other typical mounting methods include the use of a U-shaped member with the legs of the U overlapping the board or planar substrate on either side thereof. The device is attached to the bridging section between the legs of the U. In both of these methods, it is necessary to use rivets or other fasteners extending through the substrate in a direction perpendicular to the face of the substrate. This is a time consuming installation procedure usually requiring the separate installation of a flange or mounting device prior to installing the device to be edge mounted. Removal of the device requires similar time consuming steps. It is often difficult to obtain registry of the device with the edge of the board.

Heretofore, devices have been mounted on the edge of boards with difficulty and at the risk of improper registry the edge.

SUMMARY OF THE INVENTION

It is an object of the present invention to provide an improved apparatus for mounting devices on the edge of a substrate.

It is another object of the present invention to provide an inexpensive mounting member of simple construction.

It is another object of the present invention to provide a mounting apparatus which securely holds a device in registry with the edge of a narrow substrate.

It is a further object of the present invention to increase the ease with which the devices are mounted on the edge of substrates and reduce the risk of improper mounting.

Other and further objects of the present invention will become apparent upon reading of the following description.

In accordance with the present invention, there is provided an apparatus for mounting a device on an exterior edge of a substrate having an opening therein comprising a demountable member adapted to be positioned within said opening and including means for engaging an interior edge of the opening for restraining outward and lateral movement thereof and a fastener for engaging said device and adjustably secured to said member for urging said device toward the edge of the board.

BRIEF DESCRIPTION OF THE DRAWINGS

The drawings are as follows:

FIG. 1 is an end elevational view of the mounting apparatus;

FIG. 2 is a side elevational view along section 2—2 of the FIG. 1,

FIG. 3 is a side elevational view of the demountable member; and

FIG. 4 is an end elevational view of the demountable member.

DESCRIPTION OF THE PREFERRED EMBODIMENT

As illustrated in FIG. 1, a substrate in the form of a printed wiring board is illustrated at 11. The planar wiring board 11 includes a front face 13 and rear face 15 having a narrow edge in 19 on which a device in the form of electrical component 17 is mounted. The electrical component 17 includes leads 21 which terminate to conductive paths on the printed wiring board 11 through soldered joints.

To facilitate the use of the apparatus of the present invention, the substrate or board 11 includes an opening 25 in proximity to the narrow edge 19. As illustrated in detail in the drawings, the opening is of triangular shape with the base of the triangle spaced from the narrow edge 19 and inwardly from the apex of the triangle. A passageway 27 communicates from the opening 25 to the edge of the board. The passageway 27 is substantially perpendicular to the edge 19 and joins the triangularly shaped opening 25 at the apex thereof. The opening 25 on either side of the apex and passageway 27 forms an interior edge 29. The opening 25 may be conveniently cut or punched from a substrate using conventional methods.

In accordance with the principles of the present invention, the edge mounting apparatus includes a demountable member 31 adapted to be positioned within the opening 25 and including a means for engaging the interior edge 29 for restraining outward and lateral movement of the demountable member 31. The demountable member 31 includes a neck portion 33 extending so as to form shoulders 35 on either side thereof. The shoulder section 35 has a dimension less than the dimension of the opening 25 and the neck 33 has a dimension less than the passageway 27. This construction contributes to the demountable feature of member 31 in that it can be properly positioned in the opening 25 by moving it in a direction perpendicular to the board 11.

The shoulders or shoulder section 35 includes a means for engaging the board for restraining outward and lateral movement Each of the shoulders 35 include a groove 37. The bottom of each groove 37 is dimensioned so as to snugly receive the interior edge 29 of the board 11 so that the side walls of the groove 37 overlap the interior edge 29. As illustrated in the drawings, shoulder section 35 is wedge shaped with the shoulders 35 inclined outwardly and downwardly away from the neck 33 toward a base to form a wedge. The shoulder section 35 has a shape substantially identical to the opening 25.

A fastener 39 which engages the device 17 urges the device 17 toward the edge 19. The fastener or hold-down member 39 can be a self-tapping screw which is tapped into the neck 33 or a bolt which is screwed into a threaded bore in the neck 33. As illustrated in FIG. 2, the fastener 39 includes a post 43 which is secured to the neck 33 at one end and includes a threaded portion projection outwardly of the neck 33. Tabs 45 which extends outwardly from device 17 includes appertures 47. The electrical component 17 is placed against the edge 19 with the aperatures 47 receiving respective post

43. As a nut 41 is screwed downwardly over the threaded post 43, the device 17 is urged against the edge 19 into registry therewith. Further adjustment of the fastener 39 by tightening the nut 41 increases the hold-down force against the edge 19. This inward or downward pull of the device 17 against the edge 19 is resisted by the outward pull of the demountable member 31 against the interior edge 29. Each groove 37 associated with respective shoulders 35 is urged against the interior edge 29 and should be of sufficient length to resist the outward pull without causing deformation of the board 11.

What is claimed is:

1. Apparatus for mounting an electrical component on the edge of a printed wiring board comprising a demountable member having a neck and shoulders, each shoulder extending from either side of said neck, said demountable member being adapted to be mounted within an opening in said printed wiring board adjacent said edge, a groove in each shoulder adapted to engage an interior edge of said opening, fastener adapted to engage said electrical component for securing said component to said demountable member.

2. An apparatus for mounting an electrical component on an exterior narrow edge of a printed wiring board having a triangular shaped opening including an apex portion, a passageway extending from the apex portion toward the narrow edge, and a base portion spaced inwardly from the apex portion, the opening forming interior edges extending from the apex portion to the base portion, said mounting apparatus comprising a demountable member having a neck portion and a shoulder portion dimensioned to fit into said opening, said neck portion extending in the passageway, said shoulder portion having a pair of shoulders inclined downwardly and outwardly from said neck, each of said shoulders having a groove therein adapted to engage and overlap a respective interior edge for restraining lateral movement of said demountable member, a fastener adapted to engage said electrical component for securing said component to said demountable member.

* * * * *